US010181432B2

(12) United States Patent
Limaye et al.

(10) Patent No.: US 10,181,432 B2
(45) Date of Patent: Jan. 15, 2019

(54) COMPUTING SYSTEM WITH A THERMAL INTERFACE COMPRISING MAGNETIC PARTICLES

(71) Applicant: Intel Corporation, Santa Clara, CA (US)

(72) Inventors: Ameya Limaye, Chandler, AZ (US); Shubhada H. Sahasrabudhe, Gilbert, AZ (US); Nachiket R. Raravikar, Saratoga, CA (US)

(73) Assignee: Intel Corporation, Chandler, AZ (US)

( * ) Notice: Subject to any disclaimer, the term of this patent is extended or adjusted under 35 U.S.C. 154(b) by 0 days.

(21) Appl. No.: 15/461,033

(22) Filed: Mar. 16, 2017

(65) Prior Publication Data
US 2018/0269128 A1 Sep. 20, 2018

(51) Int. Cl.
*H01L 23/34* (2006.01)
*H01L 23/367* (2006.01)
(Continued)

(52) U.S. Cl.
CPC ...... *H01L 23/3672* (2013.01); *H01L 21/4882* (2013.01); *H01L 23/3736* (2013.01); *H01L 23/3737* (2013.01); *H01L 24/27* (2013.01); *H01L 24/32* (2013.01); *H01L 24/83* (2013.01); *H01L 2224/16225* (2013.01); *H01L 2224/27334* (2013.01); *H01L 2224/2936* (2013.01); *H01L 2224/29291* (2013.01); *H01L 2224/29355* (2013.01); *H01L 2224/29357* (2013.01); *H01L 2224/29471* (2013.01); *H01L 2224/32245* (2013.01); *H01L 2224/73253* (2013.01); *H01L 2224/832* (2013.01); *H01L 2924/01062* (2013.01); *H01L 2924/0715* (2013.01); *H01L 2924/1432* (2013.01)

(58) Field of Classification Search
CPC ............... H01L 23/3672; H01L 23/373; H01L 23/3733; H01L 23/3736; H01L 23/3737
USPC .................................................. 257/712, 713
See application file for complete search history.

(56) References Cited

U.S. PATENT DOCUMENTS

2015/0008592 A1* 1/2015 Boday ................... H01L 23/373
257/777
2016/0251769 A1* 9/2016 Silverman ............. H01L 23/373
428/601
(Continued)

FOREIGN PATENT DOCUMENTS

WO WO-2015-103435 A1 * 7/2015 ............... C03K 3/04

*Primary Examiner* — Brook Kebede
(74) *Attorney, Agent, or Firm* — Schwabe, Williamson & Wyatt, P.C.

(57) ABSTRACT

Embodiments of the present disclosure provide techniques and configurations for a computing system with a thermal interface having magnetic particles. In some embodiments, the computing system may include a first part, a second part, and a thermal interface to couple the first and second parts. The thermal interface may comprise a thermal interface material having magnetic particles that are aligned in a defined direction relative to a surface of the first or second part, to provide desired thermal conductivity between the first and second parts. The defined direction of alignment of magnetic particles may comprise an alignment of the particles substantially perpendicularly to the surface of the first or second part. Other embodiments may be described and/or claimed.

8 Claims, 6 Drawing Sheets

(51) Int. Cl.
*H01L 23/373* (2006.01)
*H01L 21/48* (2006.01)
*H01L 23/00* (2006.01)

(56) References Cited

U.S. PATENT DOCUMENTS

2016/0326419 A1* 11/2016 Balandin .................. C08K 3/04
2017/0002248 A1* 1/2017 Bruzda .................... C09K 5/14

* cited by examiner

COMPUTING SYSTEM WITH A THERMAL INTERFACE COMPRISING MAGNETIC PARTICLES

FIELD

Embodiments of the present disclosure generally relate to the field of semiconductor package fabrication and in particular to thermal interfaces for computer systems comprising semiconductor packages.

BACKGROUND

Currently produced computing systems, comprising semiconductor packages (e.g., integrated circuits, IC), demand higher power due to an increase in core counts, performance, and integration of multiple dies. This high power may translate to higher heat density on the dies and packages and require better thermal solutions to cool them. Current thermal solutions for dissipation of the heat generated by an IC involve using a thermal interface between the package parts, such as a die and a thermal solution, e.g., integrated heat spreader (IHS). A thermal interface may comprise a thermal interface material (TIM).

However, thermal resistance of a thermal interface material in thermal solutions may become problematic in some instances. For example, currently used thermal interface material may be soft and thus may be prone to moving inside the package (or even pumping out of the package) upon the application of external forces during a fabrication process, which may lead to higher thermal resistance values of the TIM.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure include techniques and configurations for a computing system with a thermal interface having magnetic particles. In some embodiments, the computing system may include a first part, a second part, and a thermal interface to couple the first and second parts. The thermal interface may comprise a thermal interface material having magnetic particles that are aligned in a defined direction relative to a surface of the first or second part, to provide desired thermal conductivity between the first and second parts. The defined direction of alignment of magnetic particles may comprise an alignment of the particles substantially perpendicularly to the surface of the first or second part. In embodiments, the first part of the system may comprise a die, and the second part may comprise an integrated heat spreader (IHS).

In the following detailed description, reference is made to the accompanying drawings that form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Figure 1:
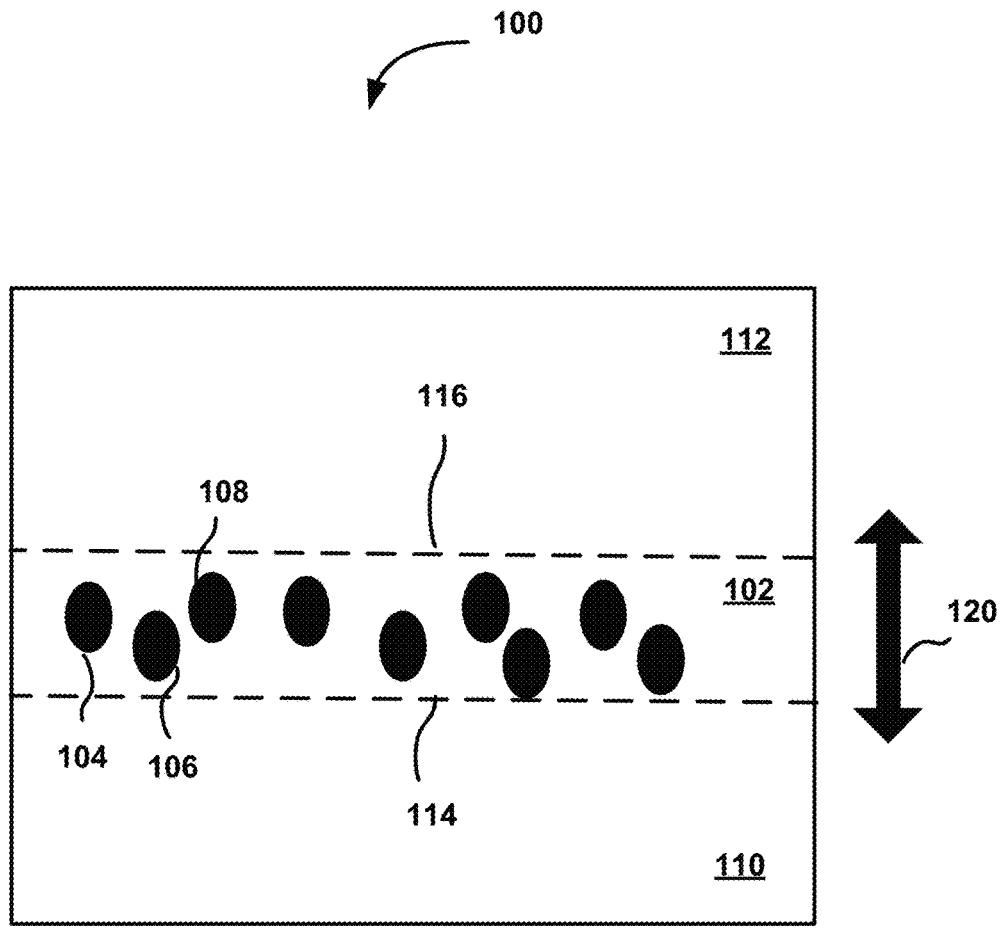
FIG. 1 illustrates some aspects of an example computing system with a thermal interface having magnetic particles, in accordance with some embodiments.

FIG. 1 illustrates some aspects of an example computing system with a thermal interface having magnetic particles, in accordance with some embodiments. In some embodiments described below in greater detail, the computing system 100 may comprise a semiconductor package device, for example an integrated circuit (IC), such as a central processing unit (CPU) or a memory unit. The computing system 100 may include a thermal interface 102 having a thermal interface material containing multiple magnetic particles, schematically indicated by numerals 104, 106, 108.

In some embodiments, the magnetic particles 104, 106, 108 may comprise magnetic nano particles (MNP). Magnetic particles or MNPs may have different sizes, ranging from 1-2 um to 30-100 um, depending upon application.

In embodiments, the thermal interface 102 may be provided between parts 110 and 112 of the computing system 100 that may require control and reduction of thermal resistance. The thermal interface material with magnetic particles may have higher thermal conductivity than traditional TIM materials, and low magnetization levels, and may be compacted between the parts 110 and 112.

For example, in some embodiments, parts 110 and 112 may include respectively a die and an integrated heat spreader coupled with the die to provide dissipation of heat produced by an integrated circuit (e.g., CPU) comprising the die.

In some embodiments, parts 110 and 112 may include respectively an IHS and a heat sink or other thermal solution configured to provide dissipation of heat produced by the CPU or other IC.

In some embodiments, parts 110 and 112 may include respectively a substrate and a die. In these embodiments, the thermal interface 102 may be provided, e.g., around the First Level Interconnect (FLI) solder joints of the computing system 100.

In some embodiments, parts 110 and 112 may include respectively a substrate and a printed circuit board (PCB). In these embodiments, the thermal interface 102 may be provided, e.g., around the Second Level Interconnect (SLI) solder joints of the computing system 100.

The above-described examples are provided for illustration purposes and do not limit the present disclosure: the thermal interface 102 with magnetic particles 104, 106, 108 may be provided between any parts of the computing system 100 that may require thermal resistance control, in order to provide an outlet for heat that may be dissipated by the CPU or other IC during operation of the computing system 100.

In some instances, the contact between the parts 110 and 112 may include unevenness and air pockets trapped between the two surfaces, which may impede the heat transfer between these parts. The thermal interface 102 may be used to improve the heat conductivity between the parts 110 and 112 (e.g., IHS and the heat sink), by reducing thermal resistance between the parts 110 and 112. Thermal resistance between the parts 110 and 112 may be reduced for at least the following reasons.

In embodiments, due to their magnetic properties, the magnetic particles 104, 106, 108 may be aligned in a direction that may provide low resistance temperature paths between the parts 110 and 112, thus improving heat conductivity between the parts 110 and 112. In other words, the magnetic particles 104, 106, 108 may align in a direction indicated by arrow 120, e.g., substantially perpendicular to surfaces 114 and 116 of the parts 110 and 112. For example, the magnetic particles 104, 106, 108 may be aligned in the direction perpendicular to surfaces 114 and 116, such as from the part 110 (e.g., a die) to the part 112 (e.g., IHS), or from the part 112 (IHS) to the part 110 (die).

In some embodiments, such alignment in a defined direction may be achieved by self-alignment of the particles. In some embodiments, the magnetic particles may be aligned in a defined direction in response to application of a magnetic field. In embodiments, the magnetic particles comprising, for example, SmCo5 flakes, coated with a polymer compound (e.g., silicone oil, approximately 2 nm thickness), may be aligned in a defined direction (e.g., self-aligned or aligned in response to an application of a magnetic field) and may maintain this orientation.

The thermal interface material with magnetic particles may offer the following advantages, compared to conventionally used materials. In some embodiments, the thermal interface material may provide very high filler density inside the thermal interface material by using extremely thin molecular layers between the filler particles. Accordingly, higher bulk conductivity of the material may be achieved. The magnetic nature of the thermal interface material of the described embodiments may keep the material compact and prevent pump out away from the die.

In some embodiments, the magnetic particles aligned as described above may provide continuous chains of metal beads, which may offer excellent thermal conductivity and high density thermal paths for conducting heat between the respective parts of the computing system. In some embodiments, low magnetization levels of the magnetic particles may ensure reduced or substantially eliminated interference with transistor circuitry.

In some embodiments, a gel-like polymer compound may be applied to the thermal interface to improve contact resistance between the parts 110 and 112 (e.g., die and IHS). In some embodiments, magnetic particles (e.g., ferromagnetic metal beads) suspended in a polymer compound may be used as TIM1 material to comprise a thermal interface between a die and IHS. Magnetic field may be applied, for example, during the atomic layer deposition (ALD) process, to align the metal particles into continuous chains connecting die to the IHS. The polymer may be cured with this metal beads alignment.

In summary, the described embodiments may provide for improved layer contact between the parts of the computing system (e.g., die and IHS) because the magnetic nature of the thermal interface described herein may assure better end of life performance. The described embodiments may provide improved thermal performance of the thermal interface, compared with conventional solutions that involve continuous metal chains connecting the die to the IHS. Some aspects of the fabrication of the thermal interface comprising magnetic particles aligned in a defined direction are described in greater detail in reference to FIGS. 2-7.

Figure 2:
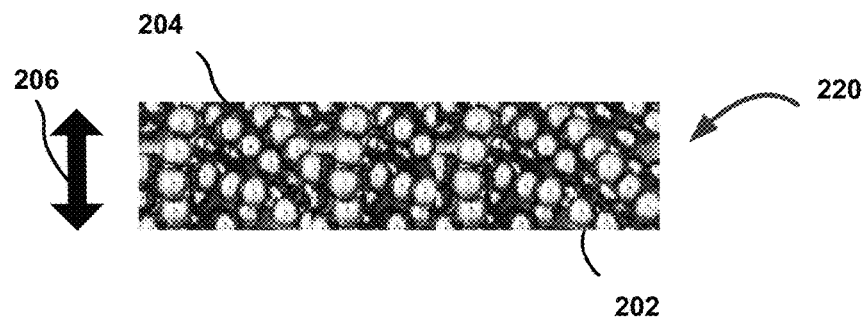
FIGS. 2-3 illustrate some aspects of an example thermal interface having magnetic particles, in different stages of assembly, in accordance with some embodiments.
Figure 3:
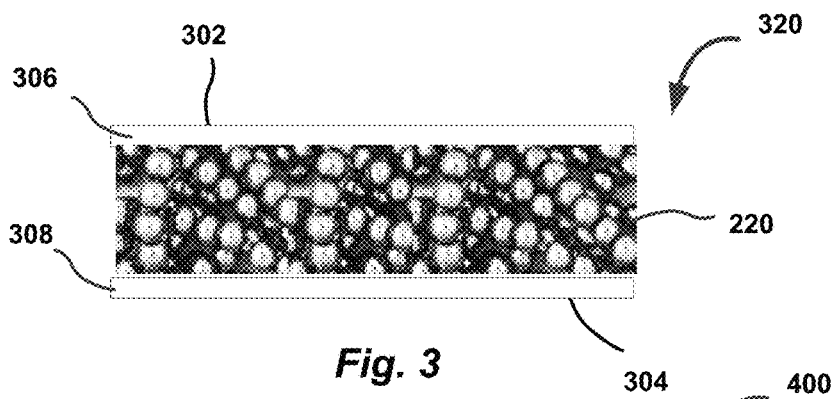

FIGS. 2-3 illustrate some aspects of an example thermal interface having magnetic particles, in different stages of assembly, in accordance with some embodiments.

FIG. 2 illustrates an example thermal interface having magnetic particles, in a preform state, in accordance with some embodiments. As shown, the thermal interface 220 in a preform state may include multiple magnetic particles 202 (similar to 104, 106, 108 of FIG. 1) and may comprise a preform shape (or simply preform) 204.

In embodiments, the provision of the thermal interface material with magnetic particles may be accomplished in a number of different ways. For example, for magnetic particles 202, some magnetic materials, such as Sm1CO5 (k=12.5 W/mK), or Sm2Co7 (k=11.5 W/mK) that have approximately 25% samarium may be used. A samarium-cobalt (SmCo) magnet is a type of rare earth magnet. These materials may have high temperature rating (up to 800 C), and may have magnetic performance of 16-33 megagauss-oersteds (MGOe) and great coercivity. Other materials like chrome plated iron or nickel/cobalt based materials can also be used. More generally, a samarium-cobalt-based material, a chrome-plated iron material, a nickel-cobalt based material, a ferritic stainless steel material, or a ferritic stainless steel material mixed with a paramagnetic material may be used for magnetic particles.

These materials may be manufactured in different ways. For example, the magnetic materials may be machined in un-magnetized state, and ground using wet grinding and diamond grinding wheel. In another example, a reduction and melt method and reduction diffusion method may be used to manufacture samarium-cobalt based magnet materials. In yet another example, a reduction and melt method may be used for magnetic materials, such as SmCo5 as well as Sm2Co17. In this example, raw material may be melted in an induction furnace filled with argon gas. Molten material may be cast into molds and cooled to fabricate ingots. The ingots may be pulverized and resulting particles may be further milled to reduce the particles to a required size, which may range from about 3 um to about 100 um.

In some embodiments, when the preform 204 is fabricated, the particles 202 may self-align in the direction of the thickness of the preform 204, indicated by arrow 206. In other words, magnetic particles 202 may self-align in the direction 206. In some embodiments, the magnetic particles 202 may be pressed into dies and an external magnetic field may be applied to orient the magnetic field of particles. In some embodiments, to obtain the preform 204 shape of the thermal interface, atomic layer deposition may be used to deposit a polymer compound, such as oleic acid, onto the particles in a layer by layer fashion.

FIG. 3 illustrates the thermal interface of FIG. 2, with coated preform surfaces, in accordance with some embodiments. In embodiments, top and bottom surfaces of the thermal interface 220 may be coated with a polymer compound, resulting in a thermal interface 320 depicted in FIG. 3. In embodiments, polymer compound layers 302, 304 may be disposed onto respective top and bottom surfaces 306, 308 of the thermal interface 220. The surfaces 306 and 308 may face respective portions of a package assembly comprising the computing system 100 of FIG. 1. Accordingly, polymer compound layers 302, 304 may be disposed on the preform 204 to provide a desired thermal contact between the thermal interface 320 and respective portions (layers) of the package assembly, such as a die and IHS. For example, the polymer compound may comprise silicone oil, such as polydimethylsiloxane (PDMS).

Figure 4:
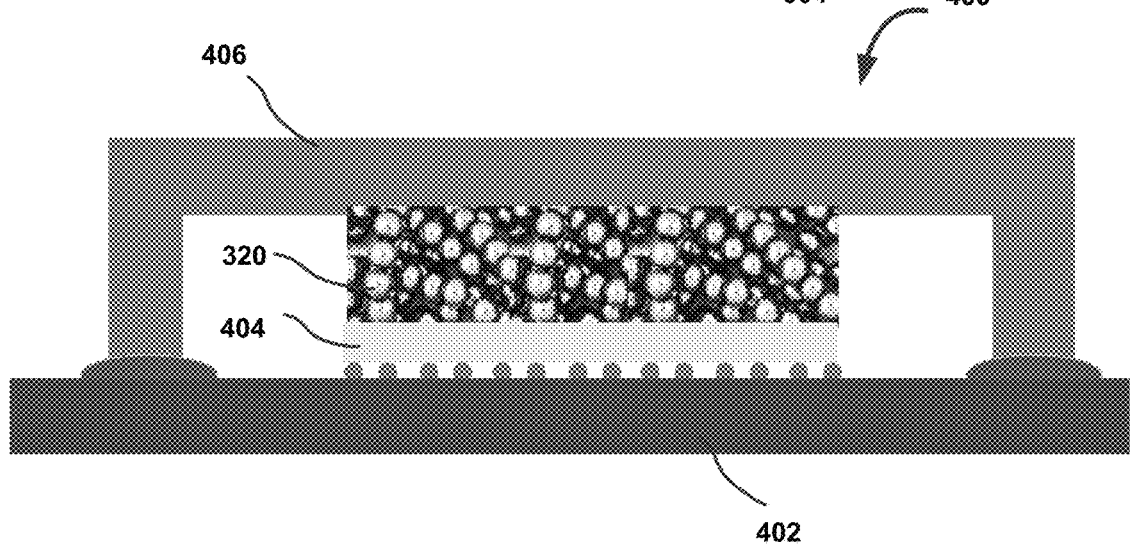
FIG. 4 illustrates an example package assembly with integrated thermal interface having magnetic particles, in accordance with some embodiments.

FIG. 4 illustrates an example package assembly with integrated thermal interface having magnetic particles, in accordance with some embodiments. As described above, a package assembly 400 may comprise the computing system 100 of FIG. 1.

In embodiments, the package assembly 400 may include a substrate 402, and a die 404 disposed on the substrate 402. The package assembly 400 may further include an IHS 406 coupled with the die 404 via the thermal interface 102, as shown. In embodiments, the thermal interface 320 (e.g., with polymer compound layers 302, 304 described in reference to FIG. 3) may be disposed on the die 404. The IHS 406 may be attached to the package assembly 400 using, for example, a thermal bonder. In addition to attaching the IHS to the package assembly 400, the thermal bonder may be used to provide the heat needed to cure the thermal interface 102 between the IHS 406 and the die 404 disposed on the substrate 402. As a result, the thermal interface 320 may be spread substantially evenly between the top surface of the die 404 and a bottom surface of the IHS 406, reducing the thermal resistance between the die 404 and IHS 406.

As described above, the thermal interface 102 may be provided between different parts of the computing system 100. For example, the thermal interface 102 may be disposed between a heat sink and the IHS, reducing the thermal resistance between the heat sink and the IHS, or between the substrate and the die, reducing the thermal resistance between the substrate and the die, or the like.

Figure 5:
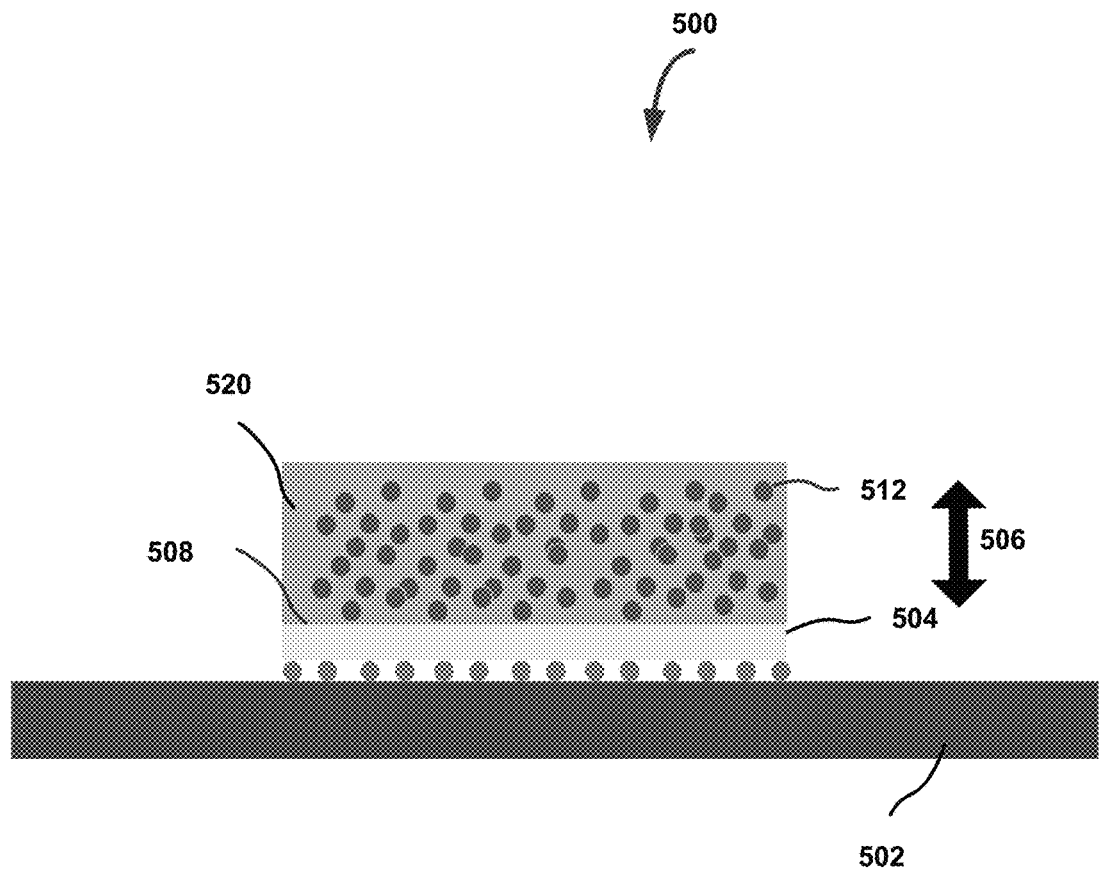
FIG. 5 illustrates another example package assembly with integrated thermal interface having magnetic particles, in accordance with some embodiments.

FIG. 5 illustrates another example package assembly with integrated thermal interface having magnetic particles, in accordance with some embodiments. As shown, the package assembly 500 may include a substrate 502, and a die 504 disposed on the substrate 502. Similarly to the embodiments of FIG. 4, the package assembly 500 may further include an IHS (not shown) coupled with the die 504 via the thermal interface 520. In embodiments, the thermal interface 520 may be disposed on the die 504, as shown. The thermal interface 520 may comprise magnetic particles 512 (similar to 104, 106, 108, or 202). The magnetic particles 512 may be mixed with a polymer compound, such as oleic acid or some other polymer. The mix may provide fluid-like properties, so that the thermal interface material may be dispensed and spread on a surface of the die 504.

The magnetic particles 512 may be aligned in a desired direction (e.g., perpendicular to the surface of the die 504) in response to application of the magnetic field to the thermal interface 520. Magnetic field may to be applied, for example, through the head of the tool, which attaches the IHS to the package assembly 500, such as a bonder. Accordingly, the magnetic particles 512 may be aligned when the IHS is attached to the package assembly 500. The alignment may be in the direction from the die 504 to the IHS (or in the opposite direction), in other words, perpendicular to a surface 508 of the die 504, as indicated by arrow 506, to provide low resistance temperature paths from the die to the IHS.

Figure 6:
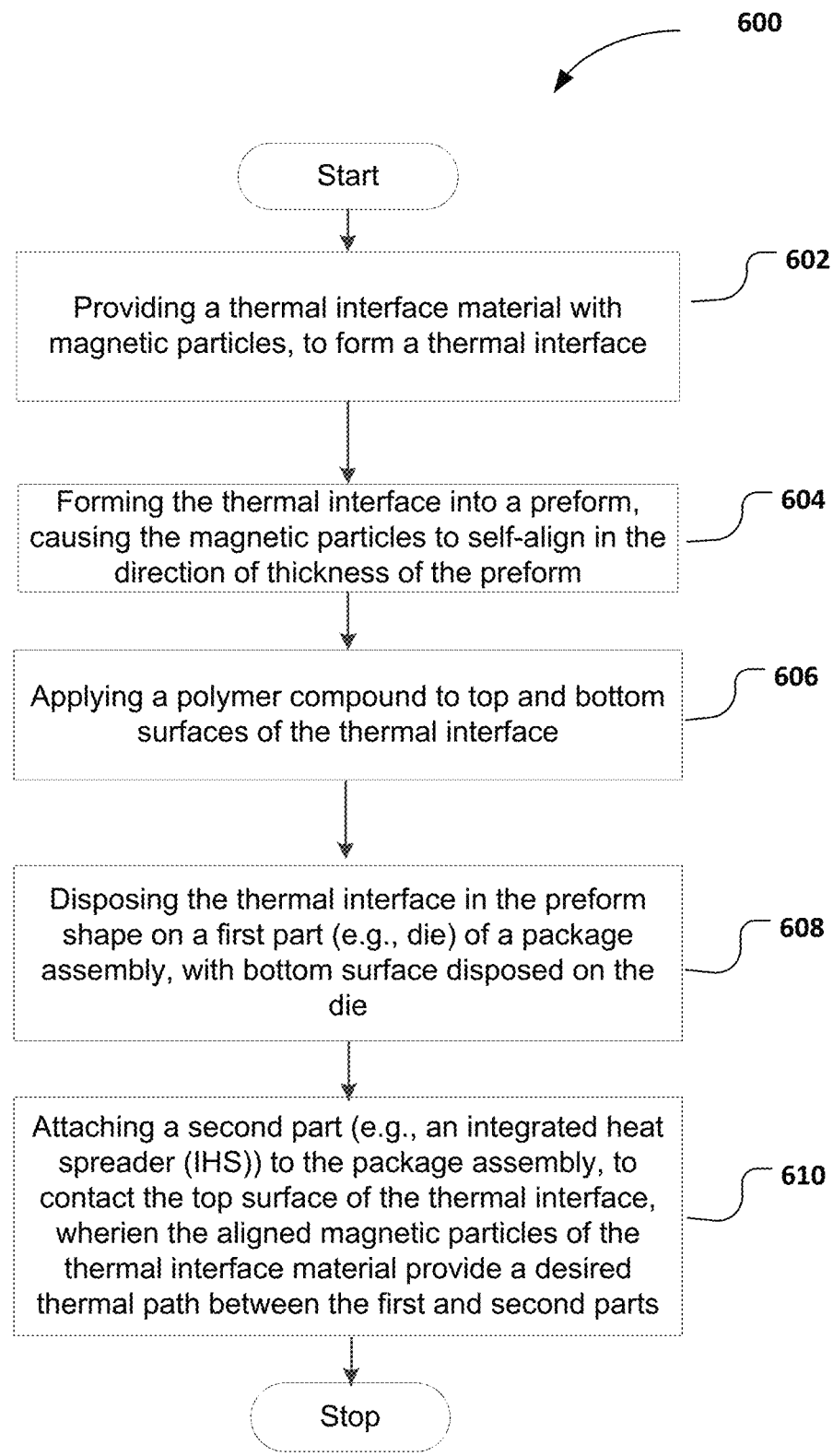
FIG. 6 is an example process flow diagram for providing a thermal interface for a computing system, in accordance with some embodiments.

FIG. 6 is an example process flow diagram for providing a thermal interface for a computing system, in accordance with some embodiments. The process 600 may comport with embodiments described in reference to FIGS. 1-4 of this disclosure. In embodiments, the computing system may comprise a package assembly, as described in reference to FIGS. 1-4.

The process 600 may begin at block 602 and include providing a thermal interface material with magnetic particles, to form a thermal interface of a package assembly. The provision of the material with magnetic particles may include operations described in reference to FIG. 2.

At block 604, the process 600 may include forming the thermal interface into a preform shape. As described above, the magnetic particles comprising the thermal interface material may self-align in the direction of thickness of the preform, thus providing thermal paths with reduced thermal resistance.

At block 606, the process 600 may include applying a polymer compound, such as silicone oil, e.g., PDMS, to top and bottom surfaces of the thermal interface, to coat the surfaces with the polymer compound.

At block 608, the process 600 may include disposing the thermal interface in a preform shape on a first part (e.g., die) of the package assembly, with bottom surface disposed on the die.

At block 610, the process 600 may include attaching a second part (e.g., an IHS) to the package assembly, such that the top surface of the thermal interface may interface with (contact) a corresponding surface of the IHS. As described, the IHS may be attached to the package assembly using a thermal bonder, which may provide the heat necessary for curing the thermal interface between the IHS and the die. The aligned magnetic particles of the thermal interface material may provide a desired thermal path between the first and second parts of the package assembly (e.g., between the IHS and the die).

Figure 7:
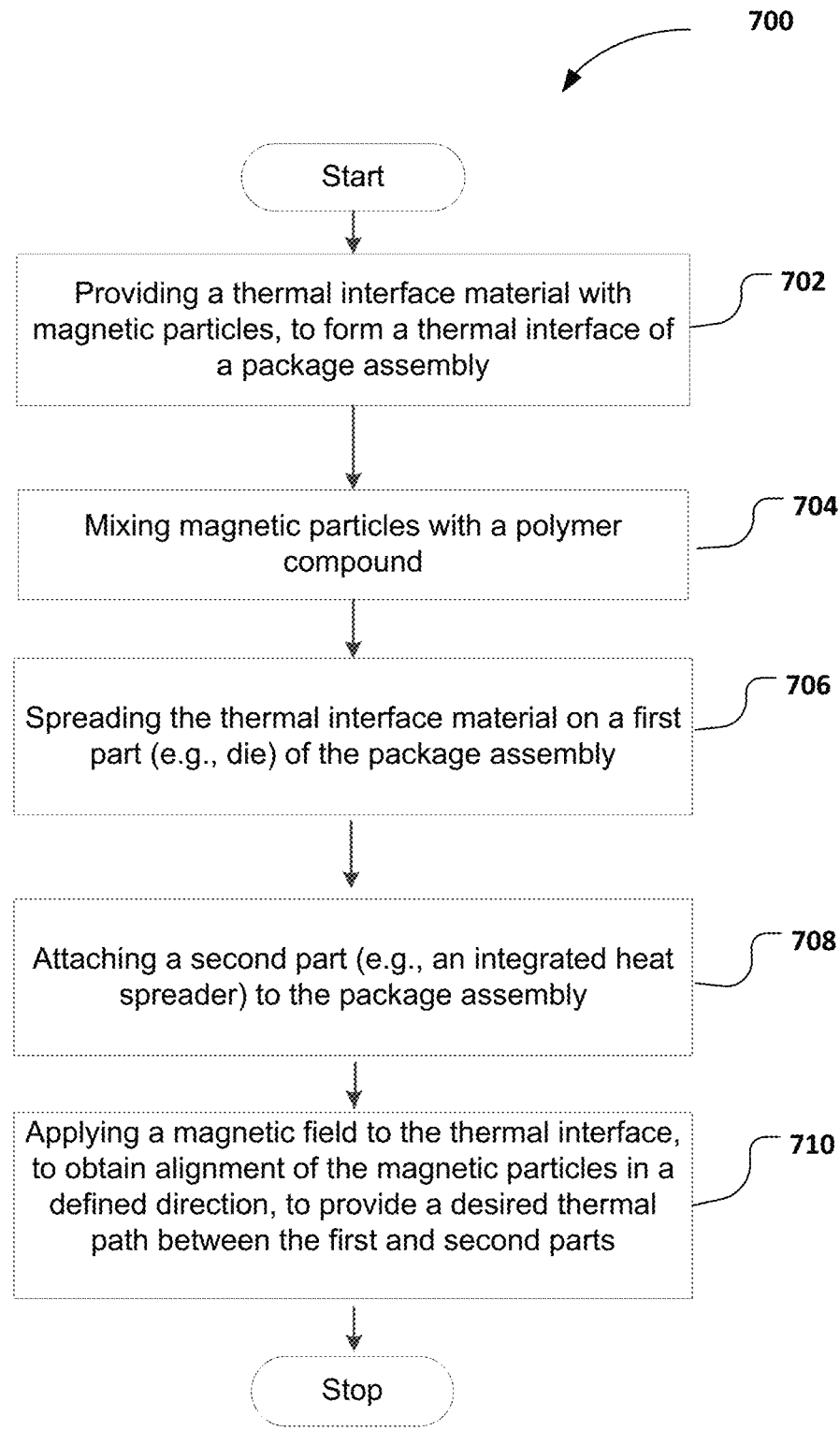
FIG. 7 is an example process flow diagram for providing a thermal interface for a computing system, in accordance with some embodiments.

FIG. 7 is an example process flow diagram for providing a thermal interface for a computing system, in accordance with some embodiments. The process 700 may comport with embodiments described in reference to FIG. 5 of this disclosure. In embodiments, the computing system may comprise a package assembly, as described in reference to FIG. 5.

The process 700 may begin at block 702 and include providing a thermal interface material with magnetic particles. The provision of the material with magnetic particles may include operations described in reference to FIG. 2.

At block 704, the process 700 may include mixing magnetic particles with a polymer compound, such as oleic acid or some other polymer. Such mixture may provide for fluid-like properties of the thermal interface material, and ensure easy dispensation of the thermal interface material on a desired surface (e.g., surface of a die of a package assembly or other surface of a computing system).

At block 706, the process 700 may include spreading the resulting mix on a first part (e.g., die or other desired surface) of the package assembly.

At block 708, the process 700 may include attaching a second part (e.g., an IHS) to the package assembly, such that a surface of the thermal interface may interface with (contact) a corresponding surface of the IHS.

At block 710, the process 700 may include applying a magnetic field to the thermal interface, to obtain alignment of the magnetic particles in a desired direction (e.g., perpendicular to the surface of the die of the package assembly), to provide a defined thermal path between the first and second parts (e.g., die and IHS). The magnetic field may be applied via the bonder that may be used to attach an IHS to the package assembly, as described in reference to FIG. 4.

Figure 8:
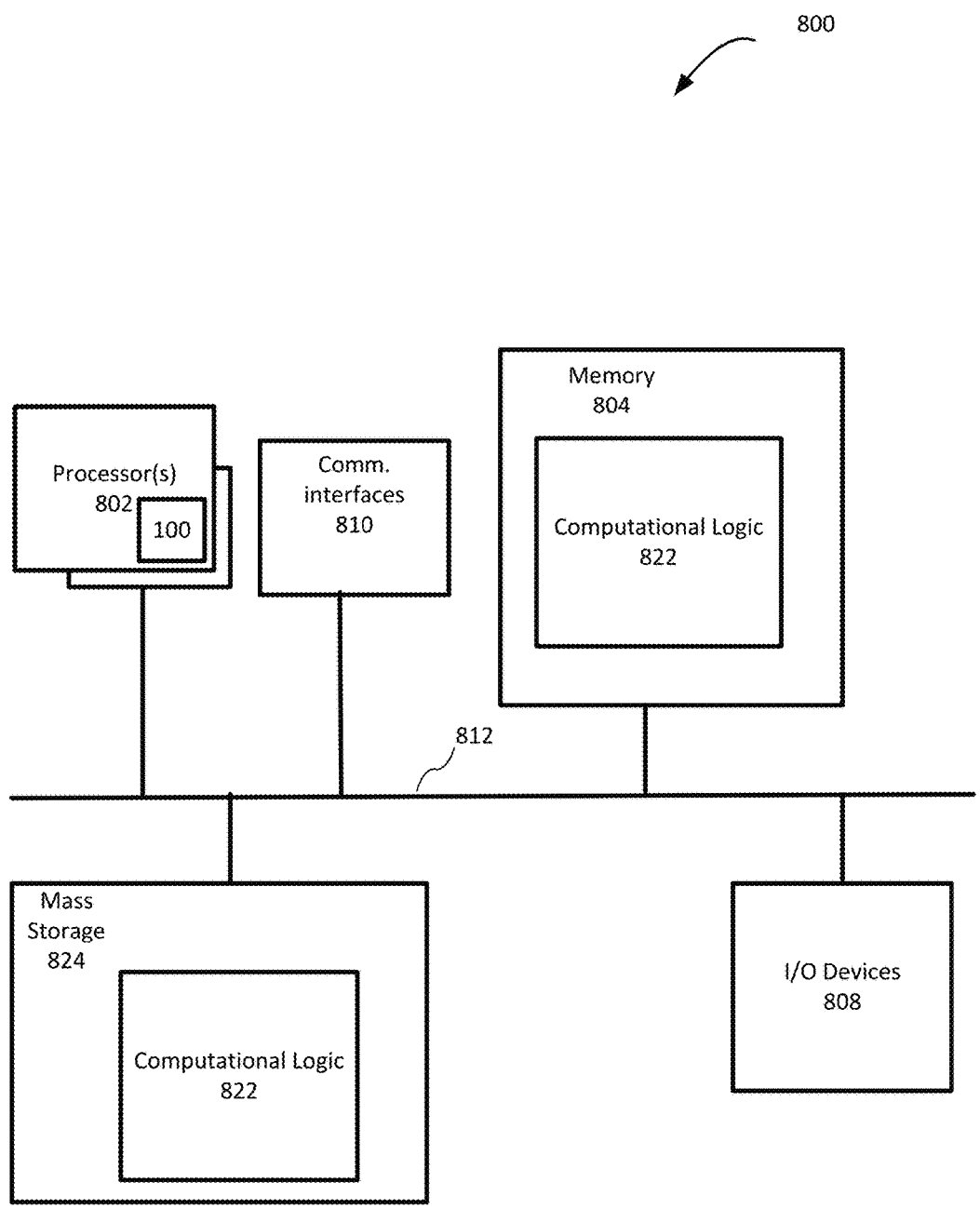
FIG. 8 illustrates an example computing system suitable for use with various components of FIGS. 1-4, in accordance with some embodiments.

FIG. 8 illustrates an example computing system 800 suitable for use with various components of FIGS. 1-4, in accordance with some embodiments. In some embodiments, example computing system 800 may include various components described in reference to FIGS. 1-4.

As shown, computing system 800 may include one or more processors or processor cores 802 and system memory 804. For the purpose of this application, including the claims, the terms "processor" and "processor cores" may be considered synonymous, unless the context clearly requires otherwise. The processor 802 may include any type of processors, such as a central processing unit (CPU), a microprocessor, and the like. The processor 802 may be implemented as an integrated circuit having multi-cores, e.g., a multi-core microprocessor.

The computing system 800 may include mass storage devices 824 (such as solid state drives, volatile memory (e.g., dynamic random-access memory (DRAM), and so forth)). In general, system memory 804 and/or mass storage devices 824 may be temporal and/or persistent storage of any type, including, but not limited to, volatile and non-volatile memory, optical, magnetic, and/or solid state mass storage, and so forth. Volatile memory may include, but is not limited to, static and/or dynamic random-access memory. Non-volatile memory may include, but is not limited to, electrically erasable programmable read-only memory, phase change memory, resistive memory, and so forth.

The computing system 800 may further include input/output (I/O) devices 808 (such as display, soft keyboard, touch sensitive screen, image capture device, and so forth) and communication interfaces 810 (such as network interface cards, modems, infrared receivers, radio receivers (e.g., Near Field Communication (NFC), Bluetooth, WiFi, 4G/5G Long Term Evolution (LTE), and so forth).

The communication interfaces 810 may include communication chips (not shown) that may be configured to operate the device 800 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 810 may operate in accordance with other wireless protocols in other embodiments.

The above-described computing system 800 elements may be coupled to each other via system bus 812, which may represent one or more buses. In the case of multiple buses, they may be bridged by one or more bus bridges (not shown). Each of these elements may perform its conventional functions known in the art. In particular, system memory 804 and mass storage devices 824 may be employed to store a working copy and a permanent copy of the programming instructions implementing firmware, an operating system and/or one or more applications to be executed on computing system.

Computational logic 822 may be implemented in assembler instructions supported by processor(s) 802 or high-level languages that may be compiled into such instructions.

The number, capability, and/or capacity of the elements 808, 810, 812 may vary, depending on whether computing system 800 is used as a mobile computing system, such as a tablet computing system, laptop computer, game console, or smartphone, or a stationary computing system, such as a set-top box or desktop computer. Their constitutions are otherwise known, and accordingly will not be further described.

At least one of processors 802 may be packaged together with memory having computational logic 822 to form a System in Package (SiP) or a System on Chip (SoC). In some embodiments, the processors 802 and/or computational logic 822 may comprise the package assembly 100 of FIG. 1 with the thermal interface 102, described in detail in reference to FIGS. 2-5.

In various implementations, the computing system 800 may comprise a mobile computing system, such as a smartphone, a tablet, a personal digital assistant (PDA), an ultra mobile PC, or any other mobile computing system. In various embodiments, the computing system may comprise a laptop, a netbook, a notebook, or an ultrabook. In further implementations, the computing system 800 may be any other electronic device that processes data.

The embodiments described herein may be further illustrated by the following examples.

Example 1 may be a package assembly, comprising: a die; and a thermal interface disposed on the die, wherein the thermal interface comprises a thermal interface material having magnetic particles that are aligned substantially perpendicularly to a surface of the die, to provide desired thermal conductivity between the die and a layer of the package assembly coupled with the die via the thermal interface.

Example 2 may include the package assembly of example 1, wherein the layer of the package assembly comprises an integrated heat spreader (IHS).

Example 3 may include the package assembly of example 2, wherein the thermal interface further comprises a polymer compound disposed on a surface of the thermal interface material that faces the die, to provide a desired thermal contact between the thermal interface and the die.

Example 4 may include the package assembly of example 3, wherein the thermal interface further comprises the polymer compound disposed on a surface of the thermal interface material that faces the layer of the package assembly, to provide a desired thermal contact between the thermal interface and the IHS.

Example 5 may include the package assembly of example 3, wherein the polymer compound comprises silicone oil, wherein the silicone oil includes polydimethylsiloxane (PDMS).

Example 6 may include the package assembly of example 1, wherein the thermal interface comprises a preformed shape, wherein the magnetic particles are aligned substantially perpendicularly to the surface of the die in response to a provision of the preformed shape to the thermal interface.

Example 7 may include the package assembly of example 1, wherein the magnetic particles of the thermal interface material comprise a size in a range from about 1 um to about 100 um.

Example 8 may include the package assembly of example 1, wherein the thermal interface material comprises one of: a samarium-cobalt-based material, a chrome-plated iron material, a nickel-cobalt based material, a ferritic stainless steel material, or a ferritic stainless steel material mixed with a paramagnetic material.

Example 9 may include the package assembly of any examples 1 to 8, wherein the thermal interface further comprises a polymer compound mixed with the magnetic particles, wherein the polymer compound comprises oleic acid.

Example 10 may include the package assembly of example 9, wherein the magnetic particles are aligned substantially perpendicularly to the surface of the die in response to an application of a magnetic field to the thermal interface.

Example 11 may be a method for providing a thermal interface, comprising: providing a thermal interface material with magnetic particles, to form a thermal interface for a package assembly; forming the thermal interface into a preform, wherein the forming causes the magnetic particles to align in a direction of a thickness of the preform; applying a polymer compound to first and second surfaces of the thermal interface, to coat the surfaces with the polymer compound; and disposing the thermal interface on a first part of the package assembly, including disposing one of the first or second surfaces on the first part, to provide a desired thermal path, formed by the aligned magnetic particles, between the first part and a second part of the package assembly with which the first part interfaces via the thermal interface.

Example 12 may include the method of example 11, wherein the first part comprises a die, wherein the second part comprises an integrated heat spreader (IHS), wherein the method further comprises: attaching the IHS to the package assembly, to contact another one of the first or second surfaces of the thermal interface.

Example 13 may include the method of example 11, wherein the polymer compound comprises silicone oil.

Example 14 may be a method for providing a thermal interface, comprising: providing a thermal interface material with magnetic particles, to form a thermal interface for a package assembly; mixing magnetic particles of the thermal interface material with a polymer compound; spreading the thermal interface material on a first part of the package assembly; and applying a magnetic field to the thermal interface, to obtain alignment of the magnetic particles in a desired direction, to provide a desired thermal path, formed by the aligned magnetic particles, between the first part and a second part of the package assembly with which the first part interfaces via the thermal interface.

Example 15 may include the method of example 14, wherein the first part comprises a die, wherein the second part comprises an integrated heat spreader (IHS), wherein the method further comprises attaching the IHS to the package assembly, to contact a surface of the thermal interface.

Example 16 may include the method of example 14, wherein the polymer compound comprises oleic acid.

Example 17 may be a computing system, comprising: a first part; a second part; and a thermal interface to couple the first and second parts, wherein the thermal interface comprises a thermal interface material having magnetic particles that are aligned in a defined direction relative to a surface of the first or second part, to provide desired thermal conductivity between the first and second parts.

Example 18 may include the computing system of example 17, wherein the defined direction of alignment of magnetic particles comprises an alignment of the magnetic particles substantially perpendicularly to the surface of the first or second part.

Example 19 may include the computing system of example 17, wherein: the first part comprises a die and the second part comprises an integrated heat spreader (IHS); the first part comprises the IHS and the second part comprises a heat sink; the first part comprises a substrate and the second part comprises a die; or the first part comprises a substrate and the second part comprises a printed circuit board (PCB).

Example 20 may include the computing system of example 17, wherein the thermal interface further comprises a polymer compound mixed with the magnetic particles, wherein the magnetic particles are aligned substantially perpendicularly to the surface of the first or second part in response to an application of a magnetic field to the thermal interface.

Example 21 may include the computing system of example 17, wherein the thermal interface further comprises a polymer compound deposited onto the magnetic particles, wherein the magnetic particles are aligned substantially perpendicularly to the surface of the first or second part in response to a provision of a preformed shape to the thermal interface.

Example 22 may include the computing system of any examples 17 to 21, wherein the computing system comprises a semiconductor package.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A package assembly, comprising:
   a die; and
   a thermal interface disposed on the die, wherein the thermal interface comprises:
   a preform that includes a thermal interface material having magnetic particles that are self-aligned substantially perpendicularly to a surface of the die, and a polymer compound disposed on a first surface of the thermal interface material that faces the die, and a second surface of the thermal interface material that faces a layer of the package assembly coupled with the die via the thermal interface,
   wherein the thermal interface is to provide desired thermal conductivity between the die and the layer of the package assembly coupled with the die via the thermal interface.

2. The package assembly of claim 1, wherein the layer of the package assembly comprises an integrated heat spreader (IHS).

3. The package assembly of claim 2, wherein the polymer compound disposed on the first surface of the thermal interface material is to provide a desired thermal contact between the thermal interface and the die.

4. The package assembly of claim 3, wherein the polymer compound disposed on the second surface of the thermal interface material is to provide a desired thermal contact between the thermal interface and the IHS.

5. The package assembly of claim 3, wherein the polymer compound comprises silicone oil, wherein the silicone oil includes polydimethylsiloxane (PDMS).

6. The package assembly of claim 1, wherein the magnetic particles are aligned substantially perpendicularly to the surface of the die in response to a provision of a preformed shape to the thermal interface.

7. The package assembly of claim 1, wherein the magnetic particles of the thermal interface material comprise a size in a range from about 1 um to about 100 um.

8. The package assembly of claim 1, wherein the thermal interface material comprises one of: a samarium-cobalt-based material, a chrome-plated iron material, a nickel-cobalt based material, a ferritic stainless steel material, or a ferritic stainless steel material mixed with a paramagnetic material.

* * * * *